United States Patent [19]

McLellan

[11] Patent Number: 4,547,723
[45] Date of Patent: Oct. 15, 1985

[54] SIMPLE FLYBACK CHECKER

[76] Inventor: Norvel J. McLellan, 1002 N. Main St., Pleasanton, Tex. 78064

[21] Appl. No.: 407,572

[22] Filed: Aug. 12, 1982

[51] Int. Cl.[4] ............................................. G01R 31/02
[52] U.S. Cl. ........................................ 324/55; 324/51
[58] Field of Search ............................. 324/55, 51, 52

[56] References Cited

U.S. PATENT DOCUMENTS

| | | | |
|---|---|---|---|
| 3,045,177 | 7/1962 | Weed | 324/54 |
| 3,769,576 | 10/1973 | Norkaitis | 324/51 |
| 3,869,664 | 3/1975 | Safer | 324/51 |
| 3,934,194 | 1/1976 | Paprocki | 324/55 X |

FOREIGN PATENT DOCUMENTS 2037039 2/1972 Fed. Rep. of Germany.
2325487 12/1974 Fed. Rep. of Germany ........ 324/55

OTHER PUBLICATIONS

Yoshino: "New Corona-Discharge Detector for Flyback Transformers", National Technical Report—Japan—Apr. 1977—pp. 291-294.

Primary Examiner—Stanley T. Krawczewicz
Assistant Examiner—Jose M. Solis

[57] ABSTRACT

A simple, low cost device for testing for shorted turns in the winding of electromagnetic coils or transformers by making use of the inductive kick voltage that is developed when the current through a coil is quickly interrupted. It uses rectified, unfiltered AC for power and a high speed switch to control the current through the coil under test. It has provisions for measuring the voltage developed by the inductive kick.

1 Claim, 1 Drawing Figure

SIMPLE FLYBACK CHECKER

BACKGROUND

The device makes use of the fact that when a coil is carrying current and the current through it is suddenly interrupted, the coil will deliver a voltage spike that is the result of a phenomenon called "inductive kick". If the coil has shorted turns it will not develop much of a voltage.

SUMMARY OF INVENTION

The object of the invention is to provide a low cost means of establishing and then interrupting the flow of current through a coil and also make it easy to measure the voltage spike that is produced just after the current is interrupted.

DESCRIPTION OF DRAWING

FIG. one is an electrical schematic of the invention.

DESCRIPTION OF INVENTION

Figure 1:
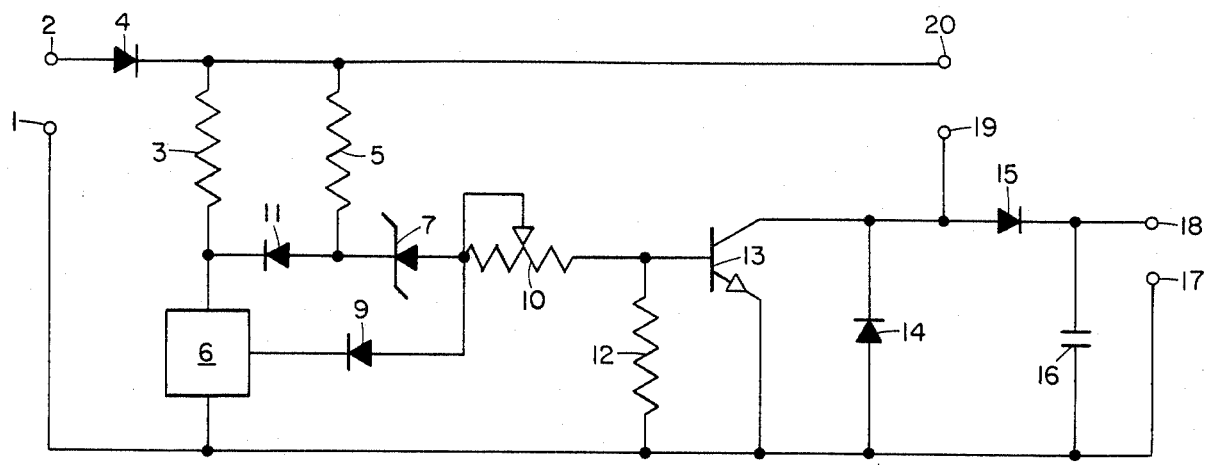

Referring to FIG. one:

Part #1 and 2 are the A. C. power input terminals. (plug-in filament transformer with 6.3 volt 1.2 amp secondary.) Part 1 is connected to device common, part 2 is connected to the anode of diode 4.

Part #4 is diode that prevents a reverse voltage from the power source from being applied to the rest of the circuit. The anode of diode 4 is connected to part 2 and the cathode is connected to parts 3,5 and 20.

Part #5 is a current limiting resistor. One lead is connected to cathode of diode 4 and one lead is connected to anode of diode 11 and to cathode of zener 7.

Part #6 is high speed switch that turns off transistor 13. Some examples of it are silicon controled rectifier, silicon controled switch or one shot multivibrator. Its power input terminal is connected one lead of resistor 3 and the cathode of diode 11. Its gate is connected to the cathode of diode 9 and its common is connected to device common.

Part #7 is a zener diode. It prevents the voltage at the anode of diode 11 from holding transistor 13 on when switch 6 is on. Its cathode is connected to resistor five and the anode of diode 11, its anode is connected to one lead of resistor 10 and to the anode of diode 9.

Part #9 is a diode that prevents the voltage at gate of switch 6 from holding transistor 13 on when switch 6 is on. Its cathode is connected to the gate of switch 6 and its anode is connected to the anode of zener 7 and one lead of resistor 10.

Part #10 is a variable resistor that controls how much current will flow through transistor 13 before switch 6 turns on and turns off transistor 13. One lead is connected to zener 7 and one lead is connected to the base of transistor 13.

Part #12 is base leak resistor for transistor 13. One lead is connected to base of transistor 13 and one lead is connected to system common.

Part #13 serves as a switch for the current through the part under test. Its collector is connected to cathode of diode 14, anode of diode 15 and terminal 19. Its base is connected to one lead of resistor 10 and its emmiter is connected to system common.

Part #14 is damper diode, its cathode is connected to collector of transistor 13 and its anode to system common.

Part #15 is diode that prevents charge on capacitor 16 from leaking back into the circuit. Its anode is connected to collector of transistor 13 and its cathode to capacitor 16 and terminal 18.

Part #16 is a filter capacitor for the output voltage. One lead is connected to terminal 18 and other lead to common.

Part #17 and 18 are output terminals. #17 is connected to common and #18 to anode of diode 15.

Part #19 and 20 are terminals to which the part under test is connected. #19 is commected to collector of transistor 13 and #20 is connected to cathode of diode 4.

Parts #3 and 11, added parts to the circuit, are a new concept in reducing the turn of time of transistor 13. They allow current to flow through and lower the impedance of switch 6 before the current of transistor 13 is effected. This allows a lower cost part for switch 6.

OPERATION

At the time when the A.C. input voltage is zero there is no current in the circuit unless a meter is connected to the output terminals. When the input voltage reaches the turn on voltage of diode 4, diode 7 and transistor 13, current starts flowing through transistor 13 and through the coil under test. When the voltage at the gate of switch 6 reaches turn on, switch 6 turns on and turns off transistor 13 quickly. A voltage spike is produced at the collector of transistor 13. This voltage spike causes capacitor 16, after several cycles, to be charged up to near the peak voltage of the spikes. The voltage of capacitor 16 can be measured with a high impedance volt-meter. When the resistance of resistor 10 is at a high value, switch 6 turns on at a lower current through transistor 13 than when resistor 10 is at a low value of resistance.

The voltage that the part under test should stand can usually be determined from the maintenance manual that the tested part is used in.

I claim:

1. A coil tester for testing coils, using inductive kick or flyback effect, comprising:
    an unfiltered half-wave rectifier means for supplying power for the test;
    a switching device means for controlling a current through a coil under test, said switching device means being turned ON at the beginning of a power cycle and being turned OFF before the end of the power cycle;
    a control device means for controlling said switching device means to be turned OFF after an appropriate time;
    a peak detector means for receiving said inductive kick after said switching device is turned OFF and for supplying a voltage indicative of the condition of the coil under test.

* * * * *